United States Patent [19]

Morgan et al.

[11] Patent Number: 5,153,502
[45] Date of Patent: Oct. 6, 1992

[54] LOW NOISE CHARGE RAMP ELECTROMETER

[75] Inventors: John P. Morgan; Thomas C. Piper, both of Idaho Falls, Id.

[73] Assignee: The United States of America as represented by the United States Department of Energy, Washington, D.C.

[21] Appl. No.: 758,045

[22] Filed: Sep. 12, 1991

[51] Int. Cl.[5] .................. H03K 13/20; G01R 17/06
[52] U.S. Cl. .......................... 324/123 R; 324/99 D
[58] Field of Search ............... 324/111, 99 D, 120, 324/123 R, 123 C, 115, 74, 158 R; 307/359

[56] References Cited

U.S. PATENT DOCUMENTS

| | | | |
|---|---|---|---|
| 3,439,272 | 4/1969 | Bailey et al. | 324/111 |
| 3,566,265 | 2/1971 | Reid | 324/111 |
| 3,921,012 | 11/1975 | Marshall, III | 307/359 |
| 3,939,459 | 2/1976 | Hoopes | 324/99 D |
| 4,082,998 | 4/1978 | Marriott | 324/111 |
| 4,804,909 | 2/1989 | Fink | 324/123 R |

Primary Examiner—Vinh Nguyen
Attorney, Agent, or Firm—Bradley W. Smith; John M. Albrecht; William R. Moser

[57] ABSTRACT

An electrometer capable of measuring small currents without the use of a feedback resistor which tends to contribute a large noise factor to the measured data. The electrometer eliminates the feedback resistor through the use of a feedback capacitor located across the electrometer amplifier. The signal from the electrometer amplifier is transferred to a electrometer buffer amplifier which serves to transfer the signal to several receptors. If the electrometer amplifier is approaching saturation, the buffer amplifier signals a reset discriminator which energizes a coil whose magnetic field closes a magnetic relay switch which in turn resets or zeros the feedback capacitor. In turn, a reset complete discriminator restarts the measurement process when the electrometer amplifier approaches its initial condition. The buffer amplifier also transmits the voltage signal from the electrometer amplifier to a voltage-to-frequency converter. The signals from the voltage-to-frequency converter are counted over a fixed period of time and the information is relayed to a data processor. The timing and sequencing of the small current measuring system is under the control of a sequence control logic unit.

11 Claims, 2 Drawing Sheets

LOW NOISE CHARGE RAMP ELECTROMETER

CONTRACTUAL ORIGIN OF THE INVENTION

The United States Government has rights in this invention pursuant to Contract No. DE-AC07-84-ID-12435 between the United States Department of Energy and Westinghouse Idaho Nuclear Company.

BACKGROUND OF THE INVENTION

Electrometers are instruments for measuring electric charge and thus, can be configured to measure either small voltages or small currents. The present invention is an instrument for measuring small currents.

The measurement of a small electrical current in the range of 1.0 E-15 amps is usually accomplished through the use of an electrometer amplifier configured as a current to voltage converter. This configuration makes use of a high megohm feedback resistor, of the order of 1.0 E+12 ohms, to develop a useful voltage from the small currents being measured. However, the resistor also acts as a noise source and generates a noise voltage defined by either the Johnson or the thermal noise equation. The thermal noise equation can be expressed as follows:

$$E = SQRT[(4K)(T)(f)(R)]$$

where SQRT = square root
E = volts RMS noise
K = Boltzman's constant
T = Temperature in degrees Celsius
f = noise bandwidth for the measurement in hertz
R = resistance in ohms The subject invention eliminates the high megohm resistor and its associated noise, E, by using a small, typically 10 to 20 picofarad, capacitor as the sole feedback element in the electrometer configuration. The electrometer output voltage using this latter configuration is proportional to the input current multiplied by the time the input current is applied divided by the value of the feedback capacitance. An equation depicting this relationship can be expressed as follows:

$$E = (I)(t)/C$$

where E = output voltage of the electrometer in volts
I = input current in amps
t = length of time input current is applied in seconds
C = feedback capacitor value in farads Thus, for this configuration, the electrometer output voltage increases linearly for a constant input current; however, when employing this system, the capacitor must be reset or zeroed before the electrometer amplifier reaches its saturation voltage. To accomplish this, the subject invention automatically resets or zeros the accumulated charge on the feedback capacitor when the voltage level of the electrometer amplifier approaches saturation.

The subject invention employs a data collection system which assimilates voltage data over fixed segments of time and then uses this data to determine the current from the above cited relationship $E = (I)(t)/(C)$.

Accordingly, it is an object of this invention to provide an electrometer which is capable of measuring small currents without experiencing the noise generated by a feedback resistor.

It is still a further object of this invention to provide a means to automatically reset or zero the accumulated charge on the feedback capacitor as required.

A further object of this invention is to provide a means to automatically compile the data from the electrometer and to determine the input current based on the accumulated data.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

To achieve the foregoing and other objectives and in accordance with the purposes of the present invention, as embodied and broadly described herein, the present invention provides for a means to measure small currents without the use of a high megohm feedback resistor. A feedback capacitor is used in lieu of the feedback resistor to eliminate the noise inherent in using a feedback resistor. The apparatus is capable of automatically zeroing or resetting the feedback capacitor. The input current to the electrometer is determined through the use of a time controlled data collection unit and a data processor where the timing function is responsive to a signal from a crystal oscillator.

DETAILED DESCRIPTION OF THE INVENTION

Figure 1:
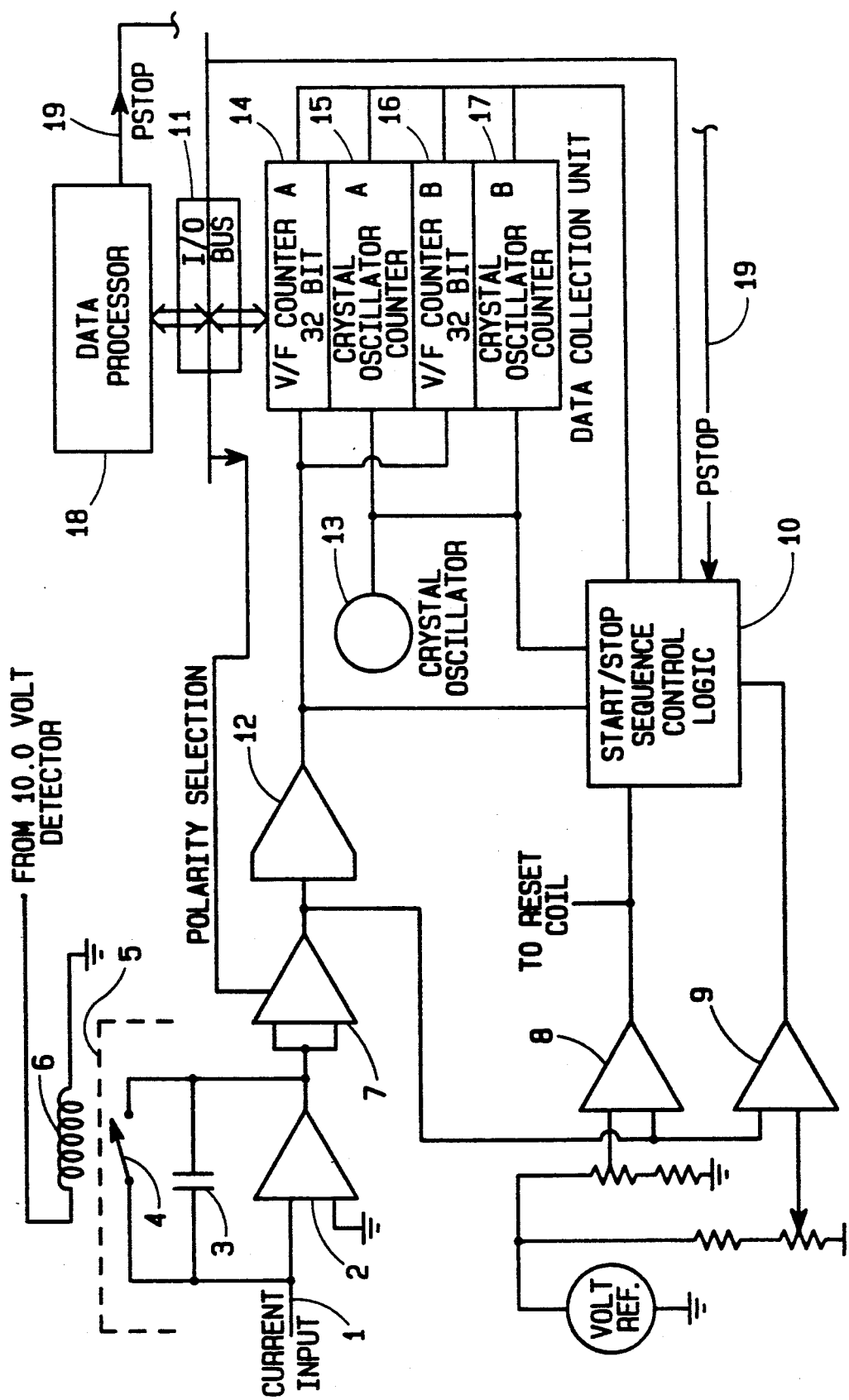
FIG. 1 depicts a schematic of the low noise charge ramp electrometer.

The present invention, a small-current measuring system, provides a means for measuring small currents through the use of an electrometer amplifier in conjunction with a feedback capacitor and a means for data collection and circuit control.

The input current is conducted by means of a source connector, 1, to the electrometer amplifier, 2. A feedback capacitor, 3, is the sole feedback element in the electrometer configuration. During operation of the small current measurement system, the feedback capacitor, 3, must be zeroed or reset prior to the electrometer amplifier, 1, reaching its saturation voltage. The resetting or zeroing of the feedback capacitor is accomplished by momentarily closing a set of normally open magnetic relay contacts, 4, that are electrically connected across the feedback capacitor, 3. The electrometer amplifier, 2, the feedback capacitor, 3, and the magnetic relay contacts, 4, are electrostatically shielded through the use of an electrostatic shield, 5. The magnetic relay contacts, 4, are closed through the application of an external magnetic field to the electrostatic shield, 5, and subsequently to the magnetic relay contacts, 4. The magnetic field is developed by energizing the magnetic reset coil, 6. The use of an external magnetic field to actuate the magnetic relay contacts, 4, eliminates the potential of electrostatic disturbances which could interfere with the sensitive electrometer input current. The magnetic relay contacts, 4, are encapsulated in glass to maintain an extremely high leakage resistance across the feedback capacitor, 3, when the relay contacts, 4, are not magnetically actuated.

The output from the electrometer amplifier, 2, is transmitted to the electrometer buffer amplifier, 7, which in turn transmits a voltage signal to a reset discriminator, 8, and a reset complete discriminator, 9. The reset discriminator, 8, detects when the electrometer buffer amplifier, 7, is producing a 10.0 volt output. When this condition occurs, the magnetic reset coil, 5, is energized creating a magnetic field which closes the magnetic relay contacts, 4. Thus, whenever the electrometer amplifier, 2, output voltage reaches 10.0 volts as reflected by a 10.0 volt output of the electrometer buffer amplifier, 7, the feedback capacitor, 3, is automatically reset or zeroed. With an input current of 1.0 E-10 amps and with a 20 picofarad feedback capacitor, 3, the feedback capacitor, 3, will be automatically reset or zeroed every 2 seconds. For smaller input currents, fewer resets will occur. However, typically, the operational electrometer amplifier, 4, has its own leakage current and results in about one automatic reset per 2 hours with no external input.

The reset complete discriminator, 9, senses when the electrometer buffer amplifier, 7, output returns to zero, thus, completing the resetting or zeroing process. When the reset is completed, a signal is transmitted to the control and sequence unit, 10, which responds by sending a signal through the I/O bus, 11, and on to the polarity section of the electrometer buffer amplifier, 7, which responds by allowing the measurement process to continue. To determine the input current to the electrometer amplifier, 2, the output voltage ramp from the electrometer amplifier, 2, must be measured two or more times with each measurement occurring for a predetermined period of time. The subject invention has the capability of automatically making the voltage measurements for the predetermined time periods.

In addition, the output voltage of the electrometer amplifier, 2, as applied to the electrometer buffer amplifier, 7, generates a plus or minus voltage gain of 1.0; this is required to configure the positive or negative input currents for use by the high precision voltage-to-frequency converter, 12. The buffer amplifier, 7, inputs a voltage signal representative of the input current to the conventional high precision voltage-to-frequency converter, 12. The voltage-to-frequency converter, 12, generates an output frequency proportional to the input voltage supplied by the buffer amplifier, 7, and thus, outputs a frequency signal in response to the ramping electrometer output voltage. The linear frequency range of the voltage-to-frequency converter, 12, is from about 300 Hz to 1 MHz. A crystal controlled oscillator, 13, operating at 1 MHz provides a precise time base for the subject small current measuring system. The data collection system for the frequency output of the small current measuring system consists of two identical frequency counters, a first frequency counter, 14, and a second frequency counter, 16. The data collection system also contains two crystal oscillator counters each of which is driven by a crystal controlled oscillator and each having a thirty-two bit count capacity which is formed by employing two concatenated sixteen bit binary counters to form a thirty-two bit counter for a first crystal oscillator counter, 15, and a second crystal oscillator counter 17. Using the crystal controlled oscillator, 13, as the input to the thirty-two bit programmable crystal oscillator counters, 15 and 17, provides a precise 1.0 second timing period for the small current measuring system. Each of the frequency counters, 14 and 16, is also configured with a thirty-two bit count capacity by using 16 bit concatenated binary counter pairs. The control and sequencing unit, 10, provides control logic for starting, sequencing, status, and stopping the measurement process. The measurement process begins with the Data Processor, 18, sending a start pulse to the start Control and Sequence Unit, 10. The start pulse causes the Control and Sequence Unit, 10, to select the A set of counters consisting of frequency counter, 14, and crystal oscillator counter, 15, which await the triggering of the sequence operation by the next arriving pulse from the voltage-to-frequency converter, 12. This sequence ensures the time synchronization of operation with the voltage-to-frequency output pulse. With the first voltage-to-frequency pulse, the crystal oscillator, 13, and the frequency counter, 14, each begin the accumulation of their respective input counts.

The count sequence continues for precisely 1.0 second, as dictated by the crystal oscillator capability, at which time the control and sequence unit, 10, is signaled by the crystal oscillator counter, 15, that it has reached the preset count time value of 1,000,000 pulses or 1.0 second. With the control and sequence unit, 10, enabled the next pulse from the voltage-to-frequency converter, 12, will terminate the A unit crystal oscillator, 14, and the frequency counter, 15, and initiate the B unit consisting of crystal oscillator, 16, and frequency counter, 17. The termination of the count accumulation in the A unit and the starting of the count accumulation in the B unit is synchronized with the voltage-to-frequency output pulses; in this sequencing, no voltage-to-frequency periods are by-passed in changing from one counter unit to the other counter unit. At this time the A unit frequency counter, 14, will contain the exact number of voltage-to-frequency pulses having occurred in the count interval. The count contained in the A unit crystal oscillator counter, 15, equals the number of 1.0 megahertz crystal oscillator pulses accumulated during this same count time interval. The number of 1.0 megahertz pulses accumulated defines the time interval precisely to plus or minus 1.0 E-6 seconds where the time interval selected is equal to the number of 1.0 megahertz pulses accumulated, a minimum of 1.0 E6, multiplied by 1.0 E-6 seconds, the period for the crystal oscillator output. This provides a precise measure of the voltage-to-frequency time interval accumulated in the crystal counters, 15 and 17. With the determination of the voltage-to-frequency from the above process, the value of the average electrometer output voltage is directly related through the voltage-to-frequency conversion constant. For this system, the constant is 1.0 microvolt per hertz for the voltage-to-frequency converter, 12.

Figure 2:
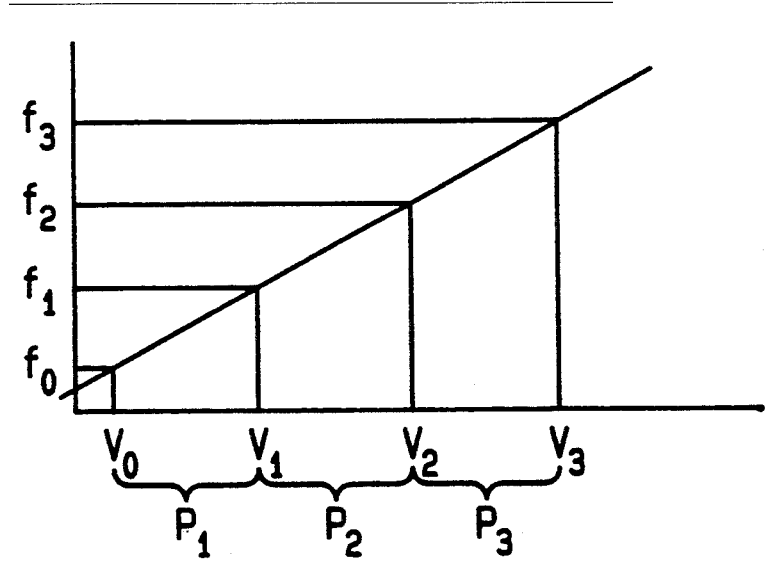
FIG. 2 represents the linearly increasing frequency from the voltage-to-frequency converter as a result of a constant input current being applied to the electrometer.

FIG. 2 represents the linearly increasing frequency from the voltage-to-frequency converter, 12, as a result of a constant input current being applied to the electrometer amplifier, 2. The frequency is proportional to the voltage at the output of the electrometer amplifier, 2. The horizontal axis is equivalent to the voltage. The precise measurement time periods are shown as P1, P2, and P3. The contents of the crystal oscillator counter, 15 or 17, give the value for this time period. The contents of the frequency counter, 14 or 16, provide the frequency value and therefore, the equivalent voltage value. Dividing the count value in the frequency counter, 14 or 16, by the time interval, contained in the crystal counter, 15 or 17, gives the average of the frequency in that interval. Since no voltage-to-frequency periods are by-passed in changing from one counter to the other counter and since two contiguous periods ar used for a single measurement, the difference between the two average values is equal to the frequency change in the measurement interval. With the voltage being proportional to the frequency, the change in voltage is obtained.

The data processor, 18, a single board computer system running a BASIC interpreter operating system, is interrupted at the completion of each measurement interval by the signal line output from the control and sequence unit, 10. The data processor, 18, transfers the data contained in the counters a well as the status of the control sequence unit, 10. The data processor, 18, then calculates the input current resulting from the average of the slope values while the next count interval is in progress. The data processor, 18, has the capability of resetting the electrometer amplifier, 2, via the PSTOP command line, 19. This command line gives the processor the capability to confine measurement to the most linear region of the measurement process operation. A new value of input current is available every 1.0 second from the data processor, 18.

We claim:

1. A system for measuring a small input current comprising:
    an electrometer amplifier;
    a feedback capacitor electrically coupled across said electrometer amplifier;
    means for resetting said feedback capacitor where said resetting means is coupled to said feedback capacitor and is responsive to the saturation voltage of said electrometer amplifier;
    means for coordinating the operation of the system where said coordinating means stops, starts and sequences the operation of a select set of system components and where said coordinating means is coupled to said resetting means;
    a voltage-to-frequency converter responsive to said electrometer amplifier where said voltage-to-frequency converter converts a voltage signal generated by said electrometer amplifier to a frequency signal having a representative number of frequency pulses;
    a frequency counting means for counting the frequency pulses of said frequency signal generated by said voltage-to-frequency converter where said frequency counting means is responsive to said coordinating means;
    a timing means for providing a precise time interval over which the frequency pulses generated by said voltage-to-frequency converter are counted where said timing means is coupled to said frequency counting means and responsive to said coordinating means;
    a data processing means for determining the small input current where said data processing means is coupled to said frequency counting means and said coordinating means.

2. The system in claim 1 in which said coordinating means includes
    an electrometer buffer amplifier coupled to said electrometer amplifier,
    a reset discriminator coupled and responsive to said electrometer buffer amplifier where the output from said electrometer buffer amplifier activates said resetting means when the output from said electrometer buffer amplifier approaches the saturation voltage of said electrometer amplifier,
    a reset complete discriminator coupled and responsive to said electrometer buffer amplifier where said rest complete discriminator senses when the output of said electrometer buffer amplifier returns to zero and subsequently outputs a signal indicating the status of said electrometer buffer amplifier,
    a sequence control logic means for controlling the sequential operation of a select set of system components where said logic control means is coupled and responsive to said reset complete discriminator and said data processing means.

3. The system in claim 2 in which said resetting means includes
    a reset coil coupled to said reset discriminator where said reset coil is activated by said reset discriminator when the output voltage from said electrometer amplifier approaches its saturation voltage,
    a magnetic relay contact electrically coupled across said feedback capacitor where said magnetic relay contact is magnetically linked to and electrostatically shielded from said reset coil such that when said reset coil is activated it generates a magnetic field which closes said magnetic relay contact and resets said feedback capacitor.

4. The system in claim 3 in which said timing means includes
    a crystal controlled oscillator which is capable of providing a precision time base for the measurement system,
    a plurality of crystal oscillator counters coupled to said crystal controlled oscillator in which one of said crystal oscillator counters is actuated during a specific time period to provide precise timing for said frequency timing means.

5. The system in claim 4 in which said frequency counting means comprises a plurality of frequency counters in which one of said frequency counters is activated during a specific time period and where said frequency counters are coupled to said sequence control logic means, to said crystal oscillator counter, and to said data processing means.

6. The system in claim 5 in which said data processing means is coupled to said frequency counter and said crystal oscillator counter and where said data processing means is responsive to said sequence control logic means and is capable of resetting the electrometer amplifier by signaling said sequence control logic means.

7. A method for employing a small current measuring system using an electrometer amplifier with a feedback capacitor where the electrometer amplifier generates a voltage signal in relation to the small current input comprising the steps of:
    transmitting the output of the electrometer amplifier to an electrometer buffer amplifier,
    monitoring the output of said electrometer buffer amplifier to determine if the electrometer amplifier is approaching its saturation voltage,
    resetting or zeroing the feedback capacitor when the electrometer amplifier approaches its saturation voltage,
    transmitting a reset complete signal to a sequence control logic unit once the electrometer buffer amplifier returns to its zero condition which in turn sends a signal to said electrometer buffer amplifier allowing the current measuring to continue, using a voltage-to-frequency converter to convert the voltage signals from the electrometer buffer amplifier to a frequency based signal, counting the pulses of said frequency based signal over a specified time period and transmitting the results to a data processing unit, and using said data processing unit to determine a pulse frequency for a set time period, and using said determined pulse frequency for two sequential periods of time to determine a voltage change, and determining a value for a current applied to the system using the calculated voltage changes.

8. The method of claim 7 in which a reset coil is energized in response to a signal generated by a reset discriminator when said electrometer amplifier approaches its saturation voltage with the result that the reset coil generates a magnetic field which closes a magnetic relay switch and resets or zeros the feedback capacitor.

9. The method of claim 8 in which a sequence control logic unit coordinates data collection by receiving a start signal from said data processing unit and selecting a frequency counter and a crystal oscillator counter which are then triggered by a frequency pulse, receiving a signal from said crystal oscillator counter that a specified time period has passed resulting in the termination of said frequency counter and said crystal oscillator counter and the initiation of an alternate frequency counter and crystal oscillator transferring a signal to said data processor indicating a data gathering cycle is complete and data contained in said frequency counter and said oscillator counter is to be transferred to said data processor.

10. The method of claim 9 in which a crystal oscillator generates a pulsed signal at a given frequency and a crystal oscillator counter counts a fixed number of pulses to produce a specified time period over which said frequency counter counts pulses associated with said frequency signal.

11. The method of claim 10 in which an output voltage generated by said electrometer amplifier causes said electrometer buffer amplifier to generate a positive or negative voltage gain to configure an input signal to said voltage-to-frequency converter.

* * * * *